US006893501B2

United States Patent
Kim et al.

(10) Patent No.: US 6,893,501 B2
(45) Date of Patent: May 17, 2005

(54) METHOD FOR MANUFACTURING A SEMICONDUCTOR DEVICE HAVING A CAPPING LAYER COVERING A CAPACITOR OF THE SEMICONDUCTOR DEVICE

(75) Inventors: Ki-chul Kim, Sungnam (KR); Sung-tae Kim, Seoul (KR); Young-sun Kim, Suwon (KR); Jeong-hee Chung, Seoul (KR); Wan-don Kim, Yongin (KR); Yun-jung Lee, Seoul (KR); Han-mei Choi, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 32 days.

(21) Appl. No.: 10/320,407

(22) Filed: Dec. 17, 2002

(65) Prior Publication Data

US 2003/0183153 A1 Oct. 2, 2003

(30) Foreign Application Priority Data

Mar. 29, 2002 (KR) ......................................... 2002-17426

(51) Int. Cl.$^7$ .............................................. C30B 25/04
(52) U.S. Cl. ............................... 117/89; 117/4; 117/97
(58) Field of Search .................................. 117/4, 89, 97

(56) References Cited

FOREIGN PATENT DOCUMENTS

KR            2000-42442            7/2000

Primary Examiner—Felisa Hiteshew
(74) Attorney, Agent, or Firm—Lee & Sterba, P.C.

(57) ABSTRACT

A method for manufacturing a capping layer covering a capacitor of a semiconductor memory device, preferably a metal-insulator-metal (MIM) capacitor, wherein the method includes forming a capacitor having a lower electrode, a dielectric layer and an upper electrode on a semiconductor substrate, forming a capping layer on the capacitor, and crystallizing the dielectric layer. Here, forming the capping layer includes stabilizing for deposition of the capping layer without providing oxygen gas, depositing the capping layer by providing a reaction source for the capping layer; and purging an inside of a reactor for forming the capping layer.

21 Claims, 3 Drawing Sheets

METHOD FOR MANUFACTURING A SEMICONDUCTOR DEVICE HAVING A CAPPING LAYER COVERING A CAPACITOR OF THE SEMICONDUCTOR DEVICE

BACKGROUND OF THE INVENTION

1. Field of the Invention

The present invention relates to a method for manufacturing a semiconductor memory device. More particularly, the present invention relates to a method for manufacturing a capping layer covering a metal-insulating-metal (MI M) capacitor.

2. Description of the Related Art

As semiconductor devices become more highly integrated, individual devices occupy less volume in the chip. Capacitors, which store information in a dynamic random access memory (DRAM) device, however, must still have a capacitance at least as high as older, larger capacitors. Accordingly, there have been several suggestions to provide capacitors having sufficient capacitance. A first suggestion is to form capacitors with three-dimensional lower electrodes, such as a cylinder or a fin type. A second suggestion is to cover the surface of the lower electrode with hemispherical grains to increase a surface area thereof. A third suggestion is to reduce a thickness of the dielectric layer. A fourth suggestion is to use a dielectric layer having a high dielectric constant or a ferroelectric layer as a dielectric layer of capacitor.

However, the methods for increasing the volume of the lower electrode and decreasing the thickness of the dielectric layer have almost reached their limits. Currently, capacitance is increased using a dielectric layer having a high dielectric constant or a ferroelectric layer.

Conventionally, $Ta_2O_5$ or $BST((Ba, Sr)TiO_3)$ is used as the dielectric layer having a high electric constant or a ferroelectric layer. Conduction materials, which do not react to the dielectric layer having a high dielectric layer or a ferroelectric layer and have a high work function, such as platinum (Pt), ruthenium (Ru), iridium (Ir), rhodium (Rh), or osmium (Os), are used for the capacitor electrode. However, a high dielectric layer requires a crystallization process after being deposited, and then a thermal process to cure internal defects, even after forming the capacitor. This necessitates a complicated manufacturing process.

Accordingly, a conventional solution is to form a capping layer on the capacitor to crystallize the dielectric layer and cure defects of the dielectric layer with a single thermal process. In this method, a capacitor including a lower electrode, a dielectric layer having a high dielectric constant and an upper electrode is formed on the semiconductor substrate. Next, a capping layer is formed to cover the capacitor. The capping layer may be a $TaO_x$ layer. Referring to FIG. 1, the capping layer is formed by stabilizing for deposition in an oxygen gas atmosphere (A), depositing a $TaO_x$ layer by providing a TaO source and oxygen gas (B), and performing a purge process (C) without providing oxygen gas. By a thermal process of the capping layer deposited as above at a selected temperature, the dielectric layer having a high dielectric constant is crystallized and cured of defects, while also crystallizing the capping layer. This avoids the need for multiple thermal processes.

However, as described above, since stabilizing for deposition and depositing the capping layer are performed in an oxygen ambient, oxygen diffuses into the upper electrode beneath the capping layer. Oxygen provided during deposition is used up in creating the $TaO_x$ capping layer, but most of the oxygen provided in the deposition stabilizing step diffuses into the upper electrode.

Accordingly, the oxygen content in the upper electrode is increased, a high resistance by-product such as TiO may be generated at the interface between the upper electrode and a barrier metal layer (Ti/TiN) of a metal interconnection layer, when the upper electrode is connected to the metal interconnection layer having the barrier metal such as Ti/TiN. At that time, the high resistance by-product, such as TiO, increases contact resistance.

SUMMARY OF THE INVENTION

It is a feature of an embodiment of the present invention to provide a method for manufacturing a semiconductor memory device that is capable of decreasing contact resistance of a capacitor.

It is another feature of an embodiment of the present invention to provide a method for manufacturing a semiconductor memory device that is able to prevent oxygen from permeating an upper electrode of a capacitor during deposition of a capping layer.

In a first embodiment of the present invention, there is provided a method for manufacturing a semiconductor memory device including forming a capacitor having a lower electrode, a dielectric layer and an upper electrode on a semiconductor substrate, forming a capping layer on the capacitor, and crystallizing the dielectric layer. Here, forming the capping layer includes stabilizing for deposition of the capping layer without providing oxygen gas, depositing the capping layer by providing a reaction source for the capping layer, and purging an inside of a reactor for forming the capping layer.

Preferably, the lower electrode is formed of doped polycrystalline silicon or one selected from the group consisting of Pt, Ru, Ir, Rh, Os, and oxides thereof. Preferably, the dielectric layer is formed of one selected from the group consisting of $TaO_x$, $AlO_x$, $TiO_x$, $(Pb, La)(Zr, Ti)O_3)$, and $(Ba, Sr)TiO_3$. Preferably, the upper electrode is formed of one selected from the group consisting of Pt, Ru, Ir, Rh, Os, and oxides thereof.

Preferably, the capping layer is formed of the same material as the dielectric layer or one selected from the group consisting of $SiO_2$, $Al_2O_3$, $TaO_x$, $TaN_x$ and $TiN_x$.

It is preferable that the act of stabilizing for deposition of the capping layer includes forming a nitride atmosphere by providing nitrogen gas inside the reactor for forming the capping layer. Preferably, the capping layer is formed of $TaO_x$, and a source of $TaO_x$, may be one selected from the group consisting of $Ta(OC_2H_5)_5$, $Ta(OCH_3)_5$, $TaCl_5$, $Ta[N(CH_3)_2]_5$, and $Ta(OC_2H_5)_4(ONC_4H_{10})$.

Preferably, oxygen gas is provided when the reaction source is provided to deposit the capping layer and that oxygen provided during deposition is consumed for forming the capping layer, so that no oxygen diffuses into the upper electrode. Purging may be performed by providing nitrogen gas inside the reactor. Preferably, crystallizing the dielectric layer includes a thermal process at between about 600 to 700° C.

In a second embodiment of the present invention, there is provided a method for manufacturing a semiconductor memory device including forming a metal-insulator-metal (MIM) capacitor on a semiconductor substrate, forming a capping layer on the MIM capacitor, and crystallizing the dielectric layer of the MIM capacitor. Preferably, forming the capping layer includes stabilizing for deposition of the capping layer by providing nitrogen gas, depositing the capping layer by providing a reaction source for the capping layer, and purging an inside of a reactor for forming the capping layer. Preferably, only nitrogen gas is provided inside the reactor when purging is performed.

BRIEF DESCRIPTION OF THE DRAWINGS

The above and other features and advantages of the present invention will become readily apparent to those of ordinary skill in the art by describing in detail preferred embodiments thereof with reference to the attached drawings in which.

DETAILED DESCRIPTION OF THE INVENTION

Figure 1:
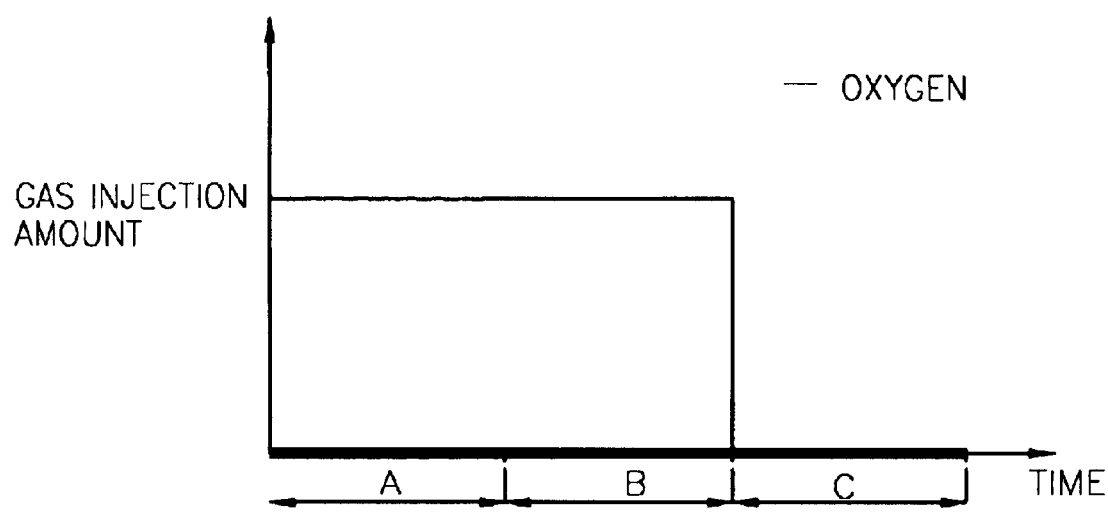
FIG. 1 is a graph showing a conventional method for manufacturing a capping layer.

Korean Patent Application No. 02-17426, filed Mar. 29, 2002, and entitled: "Method for Manufacturing a Semiconductor Device," is incorporated herein in its entirety.

The present invention now will be described more fully hereinafter with reference to the accompanying drawings, in which preferred embodiments of the invention are shown. The invention may, however, be embodied in many different forms, and should not be construed as being limited to the embodiments set forth herein. Rather, these embodiments are provided so that this disclosure will be thorough and complete, and will fully convey the concept of the present invention to those skilled in the art. In the drawings, the thickness of layers and regions may be exaggerated for clarity. It will also be understood that when a layer is referred to as being "on" another layer or a substrate, it may be directly on the other layer or the substrate, or intervening layers may also be present. Like reference numerals in different drawings refer to like elements throughout.

Figure 2:
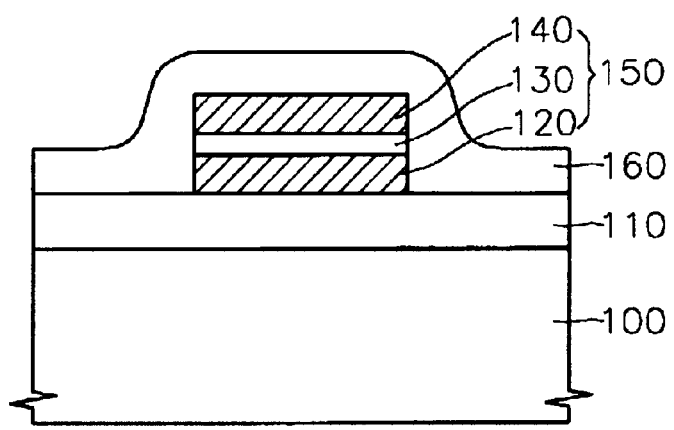
FIG. 2 illustrates a cross-sectional view showing a semiconductor memory device according to an embodiment of the present invention.

Referring to FIG. 2, an underlayer 110 is formed on a semiconductor substrate 100. The underlayer refers to a layer on which circuit devices such as transistors, and bit lines are formed. A lower electrode 120 is formed on the underlayer 110. The lower electrode 120 may be formed of a doped polycrystalline silicon layer, or from Pt, Ru, Ir, Rh, Os or an oxide thereof. In the present embodiment, the lower electrode 120 is made of Ru, and may be manufactured in any of the various shapes widely known. In addition, the lower electrode 120 is electrically connected to a circuit device in the lower portion, although this is not shown in the drawing. A $TaO_x$ layer 130 is deposited on the lower electrode 120, as a dielectric layer, and then an upper electrode 140 is formed on the $TaO_x$ layer 130 to form a capacitor 150.

Here, the electric layer may be formed of $AlO_x$, $TiO_x$, (Pb, La)(Zr, Ti) $O_3$ or (Ba, Sr)$TiO_3$, instead of $TaO_x$. In addition, the upper electrode 140 may be formed of a Ruthenium metal layer like the lower electrode 120.

Next, a capping layer 160 is formed on the upper electrode 140. At this time, the capping layer 160 simplifies the thermal process, as is widely known, and further, improves adhesion between the capacitor 150 and the interlayer insulating layer to be formed subsequently. The interlayer insulating layer insulates the capacitor 150 and later forms semiconductor devices, such as a metal interconnection layer. In addition, the capping layer 160 covers the capacitor, preventing hydrogen generated during the formation of an interlayer insulating layer from diffusing into the dielectric layer of the capacitor during a subsequent thermal process. The capping layer may be formed of $SiO_2$, $Al_2O_3$, TaO, $TaN_x$ or $TiN_x$ and is usually formed of the same material as the dielectric layer to reduce manufacturing costs. For example, the capping layer 160 is formed of a $TaO_x$ layer in the present embodiment.

Manufacture of the capping layer formed of $TaO_x$ according to an embodiment of the present invention will now be described.

Figure 3:
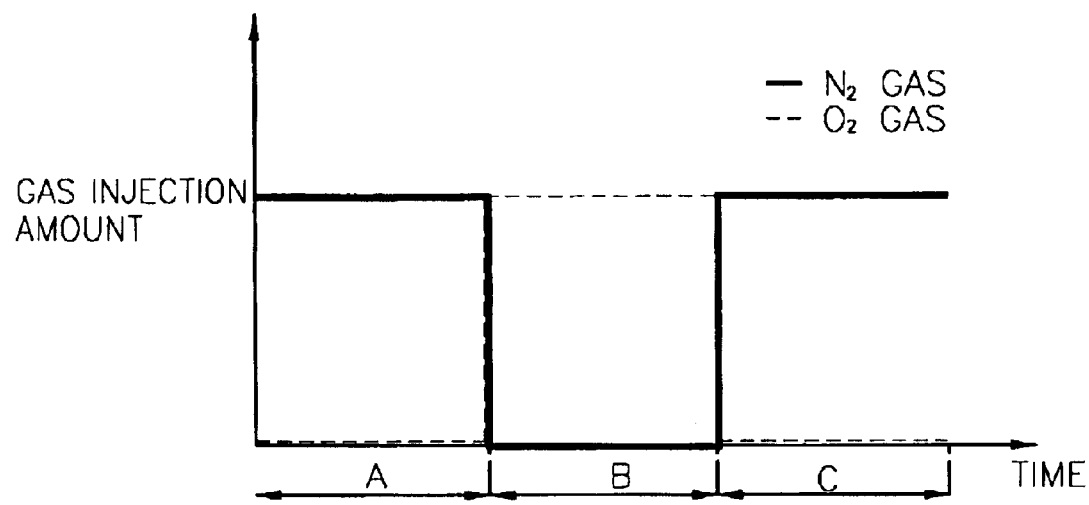
FIG. 3 is a graph showing a method for manufacturing a capping layer according to an embodiment of the present invention.

As shown in FIG. 3, formation of the capping layer 160 includes a stabilization step (A), a deposition step (B), and a purge step (C).

First, the stabilization step (A) includes providing only nitrogen gas ($N_2$) for 80 to 100 seconds instead of injecting oxygen gas ($O_2$), as in a conventional method. In the stabilization step A of a conventional method, oxygen gas diffuses into the upper electrode 140. However, in the stabilization step of the present embodiment, nitrogen gas is used instead of oxygen gas, thereby preventing oxygen gas from diffusing into the upper electrode 140.

Next, in the deposition step (B), nitrogen gas ($N_2$) is stopped and oxygen gas ($O_2$) is provided. The deposition step B is maintained for 50 to 60 seconds, preferably 58 seconds. A TaO source is also provided along with the oxygen gas. The TaO source may be $Ta(OC_2H_5)_5$, $Ta(OCH_3)_5$, $TaCl_5$, $Ta[N(CH_3)_2]_5$ or $Ta(OC_2H_5)_4$ ($ONC_4H_{10}$). The oxygen gas provided in the deposition step is consumed to react with the TaO source, so the oxygen does not diffuse into the upper electrode 140.

After the deposition, the purge process (C) is performed for 40 to 60 seconds. In the purge process, flow of the oxygen gas ($O_2$) is stopped and only nitrogen gas ($N_2$) is provided. Since, no oxygen is provided and surplus oxygen contents do not remain, oxygen does not diffuse into the upper electrode. In addition, all the process particles generated in the chamber are removed by the purge process (C).

After the capping layer 160 is formed as described above, it is thermally processed at between about 600 to 700° C. and the lower dielectric layer 140 is crystallized.

Figure 4:
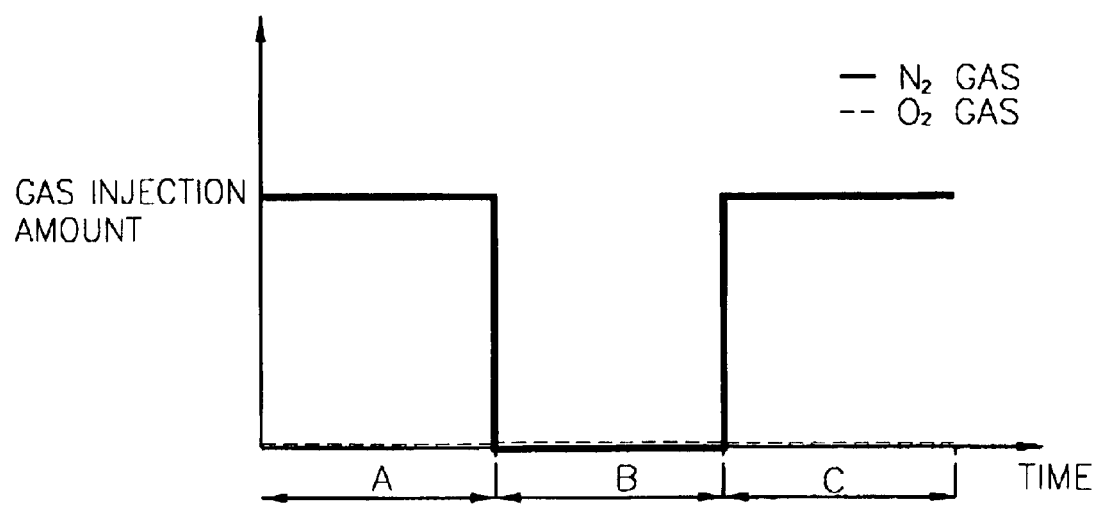
FIG. 4 is a graph showing a method for manufacturing a capping layer according to another embodiment of the present invention.

Alternatively, as shown in FIG. 4, the capping layer 160 may be formed by providing the TaO source without oxygen, in the deposition process (B). This process completely excludes oxygen from the process of depositing the capping layer 160, thereby further reducing the amount of oxygen contained in the upper electrode.

In the stabilizing step (A) for the deposition of the capping layer 160, only nitrogen gas ($N_2$) and no oxygen gas ($O_2$) is provided. Accordingly, since the stabilization for deposition of the capping layer 160 is performed by the nitrogen gas ($N_2$), no oxygen diffuses into the upper electrode 140, and oxygen contained in the upper electrode 140 is reduced. Accordingly, when the upper electrode of the capacitor contacts the metal interconnection layer, no high resistance compounds such as TiO form at the interface between the upper electrode and a barrier metal layer, so contact resistance decreases.

Figure 5:
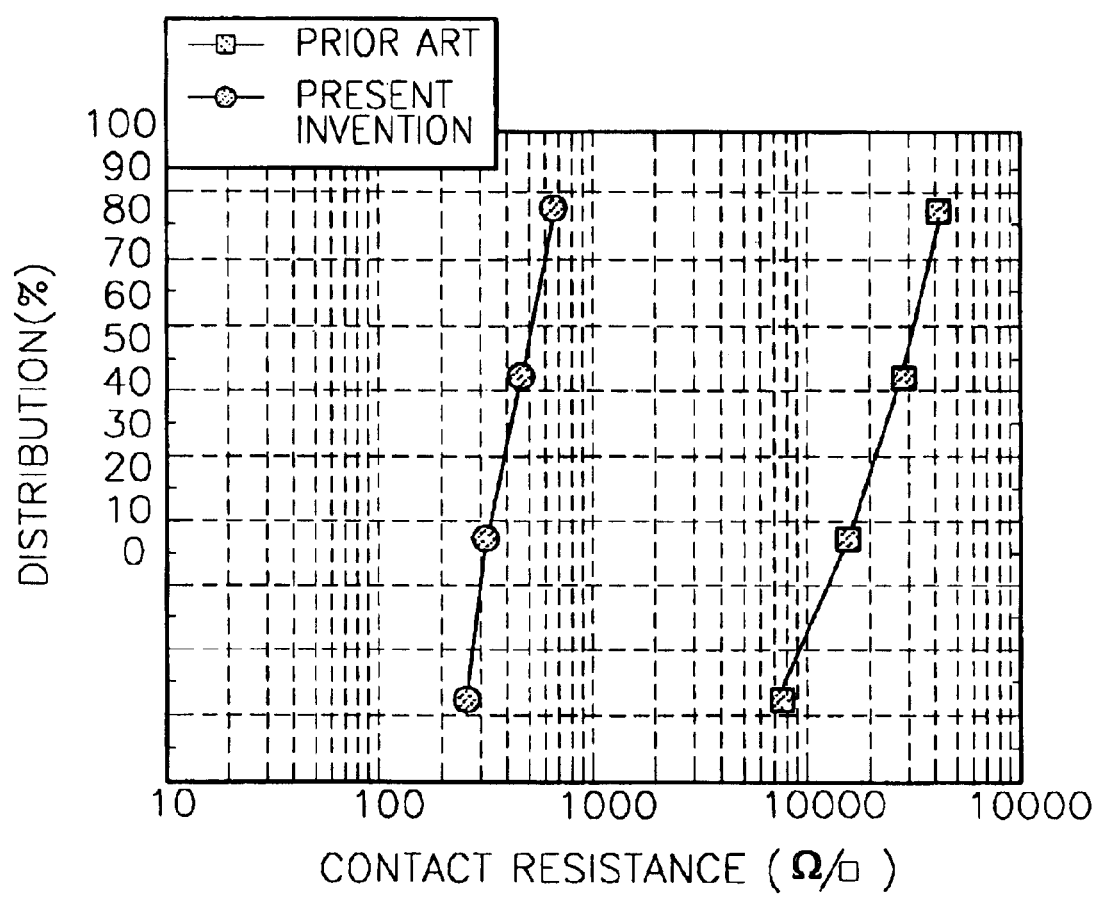
FIG. 5 is a graph comparing contact resistance of the upper electrode, when the capping layer is manufactured according to an embodiment of the present invention and according to a conventional method.

FIG. 5 is a graph comparing the contact resistance of the upper electrode when the capping layer is manufactured according to an embodiment of the present invention and according to a conventional method. The stabilization step is performed using nitrogen gas as in the present invention, instead of oxygen gas as in the conventional method, thereby reducing contact resistance.

As described above in detail, according to the present invention, when the capping layer covering the capacitor is formed, the stabilization for deposition is performed in a $N_2$ atmosphere. Accordingly, in the stabilization step for deposition of the capping layer, no oxygen diffuses into the upper electrode. Similarly, in the metal wiring process, no high resistance by-product, such as TiO, forms at the interface between the upper electrode and a barrier metal layer, thereby improving contact resistance.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for manufacturing a semiconductor memory device, comprising:
   forming a capacitor having a lower electrode, a dielectric layer and an upper electrode on a semiconductor substrate;
   forming a capping layer on the capacitor; and
   crystallizing the dielectric layer,
   wherein forming the capping layer includes:
      stabilizing for deposition of the capping layer without providing oxygen gas;
      depositing the capping layer by providing a reaction source for the capping layer; and
      purging an inside of a reactor for forming the capping layer.

2. The method for manufacturing a semiconductor memory device as claimed in claim 1, wherein the lower electrode is formed of doped polycrystalline silicon.

3. The method for manufacturing a semiconductor memory device as claimed in claim 1, wherein the lower electrode is formed of one selected from the group consisting of Pt, Ru, Ir, Rh, Os, and oxides thereof.

4. The method for manufacturing a semiconductor memory device as claimed in claim 1, wherein the dielectric layer is formed of one selected from the group consisting of $TaO_x$, $AlO_x$, $TiO_x$, (Pb, La)(Zr, Ti)$O_3$), and (Ba, Sr)$TiO_3$.

5. The method for manufacturing a semiconductor memory device as claimed in claim 1, wherein the upper electrode is formed of one selected from the group consisting of Pt, Ru, Ir, Rh, Os, and oxides thereof.

6. The method for manufacturing a semiconductor memory device as claimed in claim 4, wherein the capping layer is formed of the same material as the dielectric layer.

7. The method for manufacturing a semiconductor memory device as claimed in claim 1, wherein the capping layer is formed of one selected from the group consisting of $SiO_2$, $Al_2O_3$, $TaO_x$, $TaN_x$, and $TiN_x$.

8. The method for manufacturing a semiconductor memory device as claimed in claim 1, wherein the act of stabilizing for deposition of the capping layer comprises forming a nitride atmosphere by providing nitrogen gas inside the reactor for forming the capping layer.

9. The method for manufacturing a semiconductor memory device as claimed in claim 1, wherein the capping layer is formed of $TaO_x$, and a source of $TaO_x$, is one selected from the group consisting of $Ta(OC_2H_5)_5$, $Ta(OCH_3)_5$, $TaCl_5$, $Ta[N(CH_3)_2]_5$, and $Ta(OC_2H_5)_4$ ($ONC_4H_{10}$).

10. The method for manufacturing a semiconductor memory device as claimed in claim 1, wherein oxygen gas is provided when the reaction source is provided to deposit the capping layer.

11. The method for manufacturing a semiconductor memory device as claimed in claim 1, wherein purging is performed by providing nitrogen gas inside the reactor.

12. The method for manufacturing a semiconductor memory device as claimed in claim 1, wherein crystallizing the dielectric layer includes a thermal process at between about 600 to 700° C.

13. A method for manufacturing a semiconductor memory device comprising:
   forming a metal-insulator-metal (MIM) capacitor having an upper and lower electrode on a semiconductor substrate;
   forming a capping layer on the MIM capacitor; and
   crystallizing the dielectric layer of the MIM capacitor;
   wherein forming the capping layer includes:
      stabilizing for deposition of the capping layer by providing nitrogen gas;
      depositing the capping layer by providing a reaction source for the capping layer; and
      purging an inside of a reactor for forming the capping layer.

14. The method for manufacturing the semiconductor memory device as claimed in claim 13, wherein the lower electrode and the upper electrode are formed of one selected from the group consisting of Pt, Ru, Ir, Rh, Os, and oxides thereof.

15. The method for manufacturing a semiconductor memory device as claimed in claim 13, wherein the dielectric layer is formed of one selected from the group consisting of $TaO_x$, $AlO_x$, $TiO_x$, (Pb, La)(Zr, Ti)$O_3$), and (Ba, Sr)$TiO_3$.

16. The method for manufacturing a semiconductor memory device as claimed in claim 13, wherein the capping layer is formed of the same material as the dielectric layer.

17. The method for manufacturing a semiconductor memory device as claimed in claim 13, wherein the capping layer is formed of one selected from the group consisting of $SiO_2$, $Al_2O_3$, $TaO_x$, $TaN_x$, and $TiN_x$.

18. The method for manufacturing a semiconductor memory device as claimed in claim 13, wherein the capping layer is formed of $TaO_x$, and a source of $TaO_x$, is one selected from the group consisting of $Ta(OC_2H_5)_5$, $Ta(OCH_3)_5$, $TaCl_5$, $Ta[N(CH_3)_2]_5$, and $Ta(OC_2H_5)_4$ ($ONC_4H_{10}$).

19. The method for manufacturing a semiconductor memory device as claimed in claim 13, wherein oxygen gas is provided when the reaction source is provided to deposit the capping layer.

20. The method for manufacturing a semiconductor memory device as claimed in claim 13, wherein purging is performed by providing only nitrogen gas inside the reactor.

21. The method for manufacturing a semiconductor memory device as claimed in claim 13, wherein crystallizing the dielectric layer includes a thermal process at between about 600 to 700° C.

* * * * *